US006844084B2

(12) United States Patent
Kokta et al.

(10) Patent No.: US 6,844,084 B2
(45) Date of Patent: Jan. 18, 2005

(54) SPINEL SUBSTRATE AND HETEROEPITAXIAL GROWTH OF III-V MATERIALS THEREON

(75) Inventors: Milan R. Kokta, Washougal, WA (US); Hung T. Ong, Vancouver, WA (US)

(73) Assignee: Saint-Gobain Ceramics & Plastics, Inc., Worcester, MA (US)

(*) Notice: Subject to any disclaimer, the term of this patent is extended or adjusted under 35 U.S.C. 154(b) by 139 days.

(21) Appl. No.: 10/115,719

(22) Filed: Apr. 3, 2002

(65) Prior Publication Data

US 2003/0188678 A1 Oct. 9, 2003

(51) Int. Cl.$^7$ ................................................. B32B 9/00
(52) U.S. Cl. ...................... 428/640; 428/620; 428/555; 428/700; 428/701; 117/946
(58) Field of Search ........................ 117/946; 428/700, 428/917, 555, 620, 640, 701; 438/967; 252/518.1, 519.1

(56) References Cited

U.S. PATENT DOCUMENTS

| | | | |
|---|---|---|---|
| 3,655,439 A | 4/1972 | Seiter | |
| 3,658,586 A | 4/1972 | Wang | |
| 3,796,597 A | 3/1974 | Porter et al. | |
| 3,883,313 A | 5/1975 | Cullen et al. | |
| 3,885,978 A | 5/1975 | Doi et al. | ...................... 106/85 |
| 4,177,321 A | 12/1979 | Nishizawa | |
| 4,627,064 A | 12/1986 | Auzel et al. | |
| 4,963,520 A | * 10/1990 | Yoo et al. | ...................... 502/64 |
| 5,138,298 A | 8/1992 | Shino | ........................... 338/21 |
| 5,530,267 A | 6/1996 | Brandle, Jr. et al. | |
| 5,741,724 A | 4/1998 | Ramdani et al. | |
| 5,850,410 A | 12/1998 | Kuramata | |
| 6,023,479 A | 2/2000 | Thony et al. | |
| 6,104,529 A | 8/2000 | Brandle, Jr. et al. | |
| 2003/0007520 A1 | 1/2003 | Kokta et al. | |

FOREIGN PATENT DOCUMENTS

| | | |
|---|---|---|
| EP | 0 263 171 B1 | 11/1992 |
| EP | 0 762 930 B1 | 7/2000 |

OTHER PUBLICATIONS

Pinckney, L.R., "Transparent, high strain point spinel glass-ceramics," *Journal of Non–Crystalline Solids*, 255: 171–177, (1999).
Nakamura, S., "Current Status and Future Prospects of InGaN–Based Laser Diodes," *ISAP International*, 1: 5–17, (2000).
Kisailus D., and Lange F.F., "Growth of epitaxial GaN on LiGaO$_2$ substrates via a reaction with ammonia," *J. Mater. Res.*, 16(7): 2077–2081, (2001).
Nakamura,S., and Fasol, G., "InGaN MQW LDs Grown on MgAl$_2$O$_4$ Substrates," In *The Blue Laser Diode*, (NY:Springer–Verlag), pp. 233–243, (1997).

Morkoc, H., et al., "Large–band–gap SiC, III–V nitride, and II–VI ZnSe–based semiconductor device technologies," *J. Appl. Phys.*, 76(3): 1363–1398, (1994).
Tsuchiya, T., et al., "Epitaxial growth of InN films on MgAl$_2$O$_4$ (1 1 1) substrates," *J. of Crystal Growth 220*: 185–190 (2000).
Efimov, A.N., et al., "On an Unusual Azimuthal Orientation Relationship in the System Gallium Nitride Layer on Spinel Substrate," *Crystallography Reports*, 45(2):312–317 (2000).
Yang, H.F., et al., "Microstructure evolution of GaN buffer layer on MgAl$_2$O$_4$ substrate," *J. of Crystal Growth 193*: 478–483 (1998).
Ohsato, H., et al., "Epitaxial orientation and a growth model of (0 0 1) GaN thin film on (1 1 1) spinel substrate," *J. of Crystal Growth 189/190*:202–207 (1998).
Duan, S., et al., "MOVPE growth of GaN and LED on (1 1 1) MgAl$_2$O$_4$, " *J. of Crystal Growth 189/190*:197–201 (1998).
Nikishin, S.A., et al., "Gas source molecular beam epitaxy of GaN with hydrazine on spinel substrates," *App. Phys. Lett.* 72(19):2361–2363 (1998).
Sun, C.J., et al., "Mg–doped green light emitting diodes over cubic (1 1 1) MgAl$_2$O$_4$ substrates," *App. Phys. Lett.* 70(11):1444–1446 (1997).
Efimov, A.N., et al., "Symmetry constraints and epitaxial growth on non–isomorphic substrate," *Thin Solid Films* 260:111–117 (1995).
Kruger, M.B., et al., "Equation of state of MgAl$_2$O$_4$ spinel to 65 GPa," *Physical Review B Condensed Matter, Third Series* 56(1):1–4 (1997).
George, T., et al., "Novel symmetry in the growth of gallium nitride on magnesium aluminate substrates," *Appl. Phys. Lett.* 68(3):337–339 (1996).

(List continued on next page.)

*Primary Examiner*—Deborah Jones
*Assistant Examiner*—A B Sperty
(74) *Attorney, Agent, or Firm*—Toler, Larson & Abel, LLP; Thomas G. Field, III

(57) ABSTRACT

A spinel composition of the invention includes a monocrystalline lattice having a formula $Mg_{1-w}\alpha_w Al_{x-y}\beta_y O_z$, where w is greater than 0 and less than 1, x is greater than 2 and less than about 8, y is less than x, z is equal to or greater than about 4 and equal to or less than about 13, $\alpha$ is a divalent cationic element having an ionic radius greater than divalent magnesium, and $\beta$ is a trivalent cationic element having an ionic radius greater than trivalent aluminum. The monocrystalline lattice has tetrahedral and octahedral positions, and most of the magnesium and $\alpha$ occupy tetrahedral positions. In one embodiment, the molar ratio of aluminum to the amount of magnesium, $\alpha$ and $\beta$ can be controlled during growth of the monocrystalline lattice thereby forming a spinel substrate suitable for heteroepitaxial growth of III-V materials. A method of the invention, includes forming a monocrystalline lattice of a spinel composition. A composite includes the spinel composition layer and a III-V layer at the surface of the spinel layer. A method of forming a composite includes depositing the III-V layer onto the surface of the spinel composition using heteroepitaxial techniques.

47 Claims, No Drawings

OTHER PUBLICATIONS

Sun, C.J., et al., "Deposition of high quality wurtzite GaN films over cubic (1 1 1) $MgAl_2O_4$ substrates using low pressure and metalorganic chemical vapor deposition," *Appl. Phys. Lett.* 68(8):1129–1131 (1996).

Nakamura, S., et al., "Characteristics of InGaN multi–quantum–well–structure laser diodes," *Appl. Phys. Lett.* 68(23):3269–3271 (1996).

Kuramata, A., et al., "Properties of GaN Epitaxial Layer Grown on (1 1 1) $MgAl_2O_4$ Substrate," *Solid–State Electronics* 41(2): 251–254 (1997).

Khan, M.A., et al., "Cleaved cavity optically pumped InGaN–GaN laser grown on spinel substrates," *Appl. Phys. Lett.* 69(16):2418–2420 (1996).

Gritsyna, V.T., et al., "Structure and Electronic States of Defects in Spinel of Different Compositions $MgO.nAl_2O_3$:Me," *J. Am. Ceram. Soc.* 82 (12):3365–3373 (1999).

Temple, A., et al., "Zur Epitaxie von Galliumnitrid auf nichtstöchiometrischem Spinell im System $GaCl/NH_3/He$," *Kristall und Technik* 10(7):747–758 (1975). Abstract only.

E. Hellman, "Exotic and Mundane Substrates for Gallium Nitride Heteroepitaxy," Bell Laboratories/Lucent Technologies (no date given).

Sheldon, R.I., et al., "Cation Disorder and Vacancy Distribution in Nonstoichiometric Magnesium Aluminate Spinel, $MgO .xAl_2O_3$," *J. Am Ceram. Soc.* 82(12):3293–3298 (1999).

K.V. Yumashev, "Saturable absorber $Co^{2+}$:$MgAl_2O_4$ crystal for Q switching of 1.34—$\mu$m $Nd^{3+}$:$YAlO_3$ and 1.54–$\mu$m $Er^{3+}$:glass lasers," *Applied Optics* 38(30):6343–6346 (1999).

T.E. Mitchell, "Dislocations and Mechanical Properties of $MgO–Al_2O_3$ Spinel Single Crystals," *J. Am. Ceram. Soc.* 82(12):3305–3316 (1999).

Haisma, J., et al., "Lattice–Constant–Adaptable Crystallographics," *Journal of Crystal Growth*, 102:979–993 (1990).

Tamura, K., et al., "Epitaxial Growth of ZnO Films on Lattice–Matched $ScAlMgO_4$ (0001) Substrates," *Journal of Crystal Growth*, 214–215:59–62 (2000).

Wyon, C., et al., "Czochralski Growth and Optical Properties of Magnesium–Aluminum Spinel Doped with Nickel," *Journal of Crystal Growth*, 79:710–713 (1986).

\* cited by examiner

SPINEL SUBSTRATE AND HETEROEPITAXIAL GROWTH OF III-V MATERIALS THEREON

BACKGROUND OF THE INVENTION

Semiconductors based on single crystal nitride materials of Group-III and Group-V elements are ideal for devices such as light-emitting diodes (LED), laser diodes (LD), displays, transistors and detectors. Nitride semiconductors are particularly useful for light emitting devices in short wavelength regions (UV, blue, green, yellow) requiring high efficiency, for example 1 to 10 candles (cd). Gallium nitride (GaN) and related materials such as AlGaN, InGaN and alloys thereof, with wurtzite-crystal structure and a direct energy bandgap, are examples of the most viable materials for the above mentioned devices.

Preparation of single crystal nitride materials is technically difficult. Current procedures generally include application of epitaxial techniques that deposit the desired crystal as a thin film on a substrate such as SiC (silicon carbide), $Al_2O_3$ (sapphire or corundum) and $MgAl_2O_4$ (spinel). The most common substrate is sapphire.

Sapphire substrates, similar to the others, have a stress problem due to lattice mismatch with the nitride film. This stress can cause problems in film epitaxy, such as cracking and wafer bowing. Wafer bowing generally precludes the use of a sapphire wafer larger than 50 nm in diameter. The lattice mismatch of GaN with respect to sapphire is 13%. The lattice mismatch of GaN with respect to spinel is 9.5%.

Therefore, a need exists to significantly diminish or eliminate the above-mentioned problems, such as lattice mismatch, involved with the substrates for epitaxial deposition.

SUMMARY OF THE INVENTION

The invention is directed to a spinel composition for use in growing nitrides of Group-13 and Group-15 elements, a composite composition comprising the spinel composition and a nitride, a method of forming the spinel composition, and a method of forming the composite composition.

A spinel composition of the invention includes a monocrystalline lattice having a formula $Mg_{1-w}\alpha_w Al_{x-y}\beta_y O_z$, where w is greater than 0 and less than 1, x is greater than 2 and less than about 8, y is less than x, z is equal to or greater than about 4 and equal to or less than about 13, $\alpha$ is a divalent cationic element having an ionic radius greater than divalent magnesium, and $\beta$ is a trivalent cationic element having an ionic radius greater than trivalent aluminum. The monocrystalline lattice has tetrahedral and octahedral positions, and most of the magnesium and $\alpha$ occupy tetrahedral positions.

A composite of the invention includes a spinel layer having the composition described above and a III-V layer at a surface of the spinel layer. The III-V layer includes a crystalline lattice of a material of at least one element selected from Group-III and Group-V of the Periodic Table of Elements.

A method of the invention, includes forming a monocrystalline lattice of a spinel composition. A melt is formed that includes magnesium, aluminum and oxygen, an element $\alpha$ that is a divalent cation having an ionic radius greater than divalent magnesium wherein the molar ratio of magnesium:$\alpha$:aluminum:oxygen is (1-w):w:x:z, where w is greater than 0 and less than about 1, x is greater than about 2 and less than about 8, and z is equal to or greater than about 4 and equal to or less than about 13; immersing a spinel seed crystal in the melt; and rotating the seed crystal at a rate in a range of between about 2 and about 12 revolutions per minute, while withdrawing the seed crystal from the melt at a rate in a range of between about 1.00 mm per hour and about 2.54 mm per hour to thereby form the monocrystalline lattice.

In still another embodiment, the method of the invention includes forming the spinel composition as described above, and then depositing a III-V lattice layer on a surface of the monocrystalline lattice, the nitride lattice layer including a crystalline lattice of a III-V material of at least one element selected from the group consisting of Group III and Group V elements of the Periodic Table of Elements, thereby forming the composite.

The present invention has several advantages. For example, the lattice mismatch between the spinel composition and the III-V material generally is significantly reduced. Further, III-V crystals of superior quality can be formed. The spinel composition of the invention includes a ratio of aluminum to magnesium that often is greater than that of spinel ($MgAl_2O_4$) having an equal amount of dopant. Despite the relatively high ratio of aluminum to magnesium, most or essentially all magnesium and dopant occupy only tetrahedral positions of the crystal. Also, the compositions of the invention generally are relatively stable at reduced temperatures, such as at about 8 Kelvin (K). Modification of the crystal structure of spinel away from its standard structure permits more flexibility in the lattice parameter changes and thus a better opportunity to improve the mismatch conditions for the nitride growth process. Control of internal stress is easier than in straight spinel. The compositions allow for the doping with dopants allowing infrared absorption and thus improve heat management during the nitride deposition process.

The spinel compositions of the invention can be employed, for example, as optical window components for laser systems and other applications, such as light pipes for monitoring temperature over a wide range, and as high-power laser hosts when doped with transition metal elements or rare earth elements.

DETAILED DESCRIPTION OF THE INVENTION

The features and other details of the invention will now be more particularly described and pointed out in the claims. It will be understood that the particular embodiments of the invention are shown by way of illustration and not as limitations of the invention. The principal features of this invention can be employed in various embodiments without departing from the scope of the invention.

A first embodiment of the invention is drawn to spinel compositions. The spinel composition includes a monocrystalline lattice having a formula $Mg_{1-w}\alpha_w Al_{x-y}\beta_y O_z$, where w is greater than 0 and less than 1, x is greater than 2 and less than about 8, y is less than x, z is equal to or greater than about 4 and equal to or less than about 13.

A "1:2 spinel" refers to an embodiment where x is about 4. A "1:3 spinel" refers to an embodiment where x is about 6. Preferably, y is in the range of greater than about 0 and less than about 2. More preferably, y is in the range of greater than about 0.02 and less than about 1.0. Preferably, z is equal to or greater than about 4 and equal to or less than about 8. More preferably z is about 4. In a preferred embodiment, x is about 4 and z is about 7. In another preferred embodiment, x is about 6 and z is about 10.

In the monocrystalline lattice, α is a divalent cationic element having an ionic radius greater than divalent magnesium. Preferably, α is at least one element selected from the group consisting of calcium, cobalt and titanium. In a preferred embodiment, α is calcium.

In the monocrystalline lattice, β is a trivalent cationic element having an ionic radius greater than trivalent aluminum. Preferably, β is at least one element selected from the group consisting of scandium, gallium, chromium and iron. In a preferred embodiment, β is scandium.

The monocrystalline lattice has tetrahedral and octahedral positions. Preferably, most of the magnesium and α occupy tetrahedral positions. More preferably, all of the magnesium and α occupy tetrahedral positions.

The monocrystalline lattice optionally includes one or more dopants. Typically, the amount of dopant ion in the spinel composition of the invention is greater than about 0.02 atomic percent. Preferably, the amount of dopant ion present is in an amount in a range of between about 0.02 and about 3.0 atomic weight percent of the monocrystalline lattice. Preferably, the dopant is a transition metal or rare earth. More preferably, the dopant is selected from cobalt titanium and scandium. Even more preferably, the dopant is a $Ti^{4+}$—$Ti^{3+}$ ion pair.

The spinel composition has an average unit cell dimension in the range of between about 7.9 Å and about 8.4 Å. Generally, the unit cell dimension of the monocrystalline lattice will be less than about 8.085 Å. In a preferred embodiment, the unit cell dimension is between about 7.970 Å and about 8.083 Å.

The spinel can be cleaved or cut to form a flat surface. In one embodiment, the spinel composition can be cut or cleaved to form a disc having a diameter in a range of between about 50–100 mm, and a thickness in a range of between about 0.25–0.5 mm. In one embodiment the spinel is polished. Methods for cleaving, cutting and polishing the spinel composition can be found, for example, in Marinescu, I. D., et al., *Handbook of ceramic grinding and polishing: Properties, processes, technology, tools and typology* (Norwich, N.Y.: William Andrew Publishing) (2000), the teachings of which are incorporated by reference in their entirety.

Another embodiment of the invention is directed to methods of forming a spinel composition. A method of forming a monocrystalline lattice of a spinel composition includes forming a melt that includes magnesium, aluminum and oxygen, an element α and, optionally, an element β. α is a divalent cation having an ionic radius greater than divalent magnesium, and the molar ratio of magnesium:α:aluminum:oxygen is (1−w):w:x:z, where w is greater than 0 and less than about 1, x is greater than about 2 and less than about 8, and z is equal to or greater than about 4 and equal to or less than about 13. Preferably β is a trivalent cationic element having an ionic radius greater than trivalent aluminum.

A spinel seed crystal is immersed in the melt. In one embodiment, the spinel seed ($MgAl_2O_4$) has a major axis oriented along the <111> axis. Preferably, the spinel seed is cylindrical. The seed crystal is rotated at a rate in a range of between about 2 and about 12 revolutions per minute, while withdrawing the seed crystal from the melt at a rate in a range of between about 1.00 mm per hour and about 2.54 mm per hour to thereby form the monocrystalline lattice. In one embodiment, the withdrawal rate is in a range of between about 0.25 and about 1.0 millimeters per hour at a rotation speed in a range of between about 4 and about 12 revolutions-per-minute (RPM). Preferably, the withdrawal rate is about 1 millimeter per hour and the rotation of the seed is about 8 RPM. Crystal growth continues for a suitable period of time to form a monocrystalline lattice of suitable dimension. In one embodiment, crystal growth is continued for a period of about 150 hours. Thereafter, the crystal is cooled to about 25° C. over a period of time in a range of between about 72 and about 100 hours. Preferably, the crystal is cooled from the melt temperature, of about 2150° C. to about 25° C. over a period of time of about 100 hours.

The crystal is grown, for example, in an inductively-heated ten kHz radio-frequency (RF) generator. Control of crystal growth can be maintained by use of suitable computer software, such as Automatic Diameter Control (ADC) software, commercially available from, for example, FEC Crystal Growing Systems, which can control the shape of the growing crystal, temperature increase, cooling rates, and other pertinent parameters.

Crystal growth is commenced by heating thoroughly mixed powders of magnesium oxide (MgO), aluminum oxide ($Al_2O_3$) and oxides including elements α and optionally oxides including element β in a suitable crucible, such as an iridium crucible. For example, to form a spinel composition having the formula $Mg_{1-w}Co_wAl_xO_z$, the crucible contains magnesium oxide (MgO), cobalt oxide ($Co_3O_4$) and aluminum oxide ($Al_2O_3$). The crucible is heated in a growth chamber to a suitable temperature, such as a temperature in a range of between about 1900° C. and about 2150° C. Preferably, the crucible and its contents are heated to a temperature of about 2150° C. to form a melt. Dopants, such as suitable transition metals and rare earths, can be added to the oxide powders during mixing and prior to forming the melt. Preferably, the oxides are metallic ions of similar size and oxidation states as constituent oxides.

Another embodiment of the invention is directed to a composite. The composite includes the spinel composition, as described above, and a III-V layer at a surface of the spinel. For example, the III-V layer can be deposited at a surface of the spinel composition that has been cut or cleaved, and polished. The III-V layer includes a crystalline lattice of a nitride of at least one element selected from Group 13 (also known as Group III) and Group 15 (also known as Group V) of the Periodic Table of Elements. "Group 13 elements" are elements selected from Group 13 of the Periodic Table of the Elements, including boron, aluminum, gallium, indium and titanium. "Group 15 elements" are elements selected from Group 15 of the Periodic Table of Elements, including nitrogen, phosphorous, arsenic, antimony and bismuth. Examples of preferred III-V layers include GaN, AlN, InN, AlInN, AlGaN, and InGaN and alloys thereof. Preferably, the III-V layer is GaN. Other suitable III-V layers include GaPN, GaP, GaAs, GaAsN, etc.

Preferably the lattice mismatch between the spinel composition and the deposited III-V layer is less than about 13%. More preferably, the lattice mismatch is less than about 8.5%. Even more preferably, the lattice mismatch is less than about 5%. Lattice mismatch is the disparity in lattice parameters of the substrate crystal and the deposited III-V crystal. The lattice mismatch and can be described by the formula $(a_s-a_n)/a_n$, where $a_s$ is the lattice constant of the substrate and $a_n$ is the lattice constant of the III-V material. Unless otherwise noted, lattice mismatch values refer to evaluation at 20° C.

Still another embodiment of the invention is directed to a method of forming a III-V composite. The method of forming a III-V composite includes depositing a III-V material onto monocrystalline lattice of a spinel composition, as described above. In one embodiment, the III-V material is deposited using a suitable epitaxial technique. Examples of suitable epitaxial techniques can be found in Maruska, H. P. and Tietjen, J. J., "The preparation and properties of vapor-deposited single-crystalline GaN," *Applied Physics Letters*, 15(10) (Nov. 15, 1969), the teachings of which are incorporated by reference in their entirety.

The invention is illustrated by the following examples, which are not intended to be limiting in any way.

EXEMPLIFICATION

Example 1

The 3:1 "Inverse" spinel was grown by the Czochralski pulling technique. Crystal was grown from Iridium crucible with dimensions 4" diameter and 6" tall. The crucible was heated by radio frequency (RF) power generator in order to melt the spinel charge. The charge was prepared by mixing:

| | |
|---|---|
| 1479.52 gms of $Al_2O_3$ | |
| 238.48 gms of MgO | | to form 1988 gms of charge.

The ambient atmosphere was nitrogen flowing at the rate of 40CFH through an enclosure containing the crucible, RF coupling coil and zirconium oxide insulation. The diameter control was accomplished via ADC (automatic diameter control) software. The parameters were set as follows:

| | |
|---|---|
| Pull Rate: | 1 mm/hr |
| Desired Diameter: | 57 mm |
| Desired Length: | 150 mm |
| Rotation Rate: | 4 rpm |

After a run consisting of:

6 hrs heat up 20 hrs shouldering 140 hrs growth 10 hrs cool down a crystal 2.3" in diameter, 6" long was harvested. The crystal was of good internal quality showing no inclusions, bubbles, cracks, or any other internal defects.

Example 2

A spinel substrate is formed by the following method: crystal orientation of the seed is in the (111) direction using a "bond" type x-ray difractometer. The crystal is ground to a diameter of 51 mm using a diamond grinding wheel. Axial orientation is verified using an x-ray difractometer. Barstock (oriented crystal ground to diameter) is glued to a graphite angle block and sliced by using abrasive slurry wire saw blanks of thickness 0.685 mm. Crystal discs are lapped using a double-sided lapping machine. An example of suitable lapping conditions is as follows:

Example of lapping conditions:

| | | |
|---|---|---|
| Lapping pressures: | low | 75 lbs |
| | high | 150 lbs |

-continued

| | |
|---|---|
| Timer setup: | 30 hrs |
| RPM: | 45 |

Example of lapping abrasive slurry:

| | |
|---|---|
| DI water: | 151 |
| Boron Carbide: | 8.6 lbs |
| Kelzan: | 28 gms |

Lapped blanks are polished on one side using a "CYBEQ" polishing machine. An example of a suitable machine setup is as follows:

Example of machine setup:

| | |
|---|---|
| Low Pressure: | 4 psi inch$^2$ |
| High Pressure: | 9 |
| Post Polish Pressure: | 4 |
| Rinse Cycle Pressure: | 4 |
| Temp Set Point: | 52–54° C. |

Material Setup:

Alumina abrasive slurry.

After polishing, the wafers are inspected for chips, scratches, fractures, wire saw marks, etc.

Equivalents

While this invention has been particularly shown and described with references to preferred embodiments thereof, it will be understood by those skilled in the art that various changes in form and details may be made therein without departing from the scope of the invention encompassed by the appended claims.

What is claimed is:

1. A spinel composition, comprising a monocrystalline lattice having a formula $Mg_{1-w}\alpha_w Al_{x-y}\beta_y O_z$, where w is greater than 0 and less than 1, x is greater than 2 and less than about 8, y is less than x, z is equal to or greater than about 4 and equal to or less than about 13, α is a divalent cationic element having an ionic radius greater than divalent magnesium, and β is a trivalent cationic element having an ionic radius greater than trivalent aluminum, said lattice having tetrahedral and octahedral positions, and wherein most of the magnesium and α occupy tetrahedral positions.

2. The spinel composition of claim 1, wherein α is at least one element selected from the group consisting of calcium, cobalt, titanium and zinc.

3. The spinel composition of claim 2, wherein α is calcium.

4. The spinel composition of claim 2, wherein α is $Zn^{2+}$.

5. The spinel composition of claim 1, wherein W is in a range of between about 0.02 and about 0.95.

6. The spinel composition of claim 1, wherein β is at least one element selected from the group consisting of scandium, gallium, chromium and iron.

7. The spinel composition of claim 1, wherein β is scandium.

8. The spinel composition of claim 1, wherein y is in a range of greater than about 0.02 and less than about 2.

9. The spinel composition of claim 1, wherein z is about 4.

10. The spinel composition of claim 1, wherein x is about 4 and z is about 7.

11. The spinel composition of claim 1, wherein x is about 6 and z is about 10.

12. A spinel composition, comprising a monocrystalline lattice and a dopant, the monocrystalline lattice having a formula $Mg_{1-w}\alpha_w Al_{x-y}\beta_y O_z$, where w is greater than 0 and less than 1, x is greater than 2 and less than about 8, y is less than x, z is equal to or greater than about 4 and equal to or less than about 13, $\alpha$ is a divalent cationic element having an ionic radius greater than divalent magnesium, and $\beta$ is a trivalent cationic element having an ionic radius greater than trivalent aluminum, said lattice having tetrahedral and octahedral positions, and wherein most of the magnesium and $\alpha$ occupy tetrahedral positions.

13. The spinel composition of claim 12, wherein the dopant is selected from the group consisting of cobalt, titanium, scandium and chromium.

14. The spinel composition of claim 1, wherein the lattice has an average unit cell dimension in a range of between about 7.9 Å and about 9.0 Å.

15. A composite, comprising:
   a) a spinel layer that includes a monocrystalline lattice having a formula $Mg_{1-w}\alpha_w Al_{x-y}\beta_y O_z$, where w is less than 1, x is greater than 2 and less than about 8, y is less than x, z is equal to or greater than 4 and equal to or less than about 13, $\alpha$ is a divalent cationic element having an ionic radius greater than divalent magnesium, and $\beta$ is a trivalent cationic element having an ionic radius greater than trivalent aluminum, said lattice having tetrahedral and octahedral positions, and wherein most of the magnesium and $\alpha$ occupy tetrahedral positions; and
   b) a III-V layer at a surface of the spinel layer, said III-V layer including a crystalline lattice of a III-V material of at least one element selected from the group consisting of Group III and Group V elements of the Periodic Table of Elements.

16. The composite of claim 15, wherein the III-V layer is selected from the group consisting of GaN, AlGaN and InGaN.

17. The composite of claim 16, wherein the spinel layer and the III-V layer have a lattice mismatch of less than about 13 percent.

18. The composite of claim 17, wherein $\alpha$ is at least one element selected from the group consisting of calcium, cobalt and titanium.

19. The composite of claim 18, wherein $\beta$ is at least one element selected from the group consisting of scandium, gallium, chromium and iron.

20. The composite of claim 19, wherein w is 0, $\beta$ is scandium, and the nitride layer is GaN.

21. The composite of claim 20, wherein the lattice mismatch between the spinel layer and the nitride layer is less than about 8.5%.

22. The composite of claim 21, wherein the lattice mismatch between the spinel layer and the nitride layer is less than about 5%.

23. The composite of claim 15, wherein the spinel layer further includes a dopant.

24. The composite of claim 23, wherein the dopant is selected from the group consisting of cobalt, titanium, scandium, chromium and zinc.

25. The composite of claim 24, wherein the dopant is a $Ti^{4+}$-$Ti^{3+}$ ion pair.

26. A method of forming a spinel composition having a monocrystalline lattice, comprising the steps of:

a) forming a melt that includes magnesium, aluminum and oxygen, an element $\alpha$ that is a divalent cation having an ionic radius greater than divalent magnesium wherein the molar ratio of magnesium:$\alpha$:aluminum:oxygen is (1-w):w:x:z, where w is greater than 0 and less than about 1, x is greater than about 2 and less than about 8, and z is equal to or greater than about 4 and equal to or less than about 13;

b) immersing a spinal seed crystal in the melt; and c) rotating the seed crystal at a rate in a range of between about 2 and about 12 revolutions per minute, while withdrawing the seed crystal from the melt at a rate in a range of between about 1.00 mm per hour and about 2.54 mm per hour to form thereby said monocrystalline lattice.

27. The method of claim 26, wherein the element $\alpha$ is at least one element selected from the group consisting of calcium, cobalt and titanium.

28. The method of claim 27, wherein the element $\alpha$ is calcium.

29. The method of claim 26, wherein the melt further includes an element $\beta$, wherein said $\beta$ is a trivalent cation that has an ionic radius greater than trivalent aluminum.

30. The method of claim 29, wherein $\beta$ is at least one element selected from the group consisting of scandium, gallium, chromium and iron.

31. The method of claim 30, wherein $\beta$ is scandium.

32. The method of claim 26, further including the step of cleaving the spinel composition to form a flat surface.

33. The method of claim 32, further including the step of polishing the flat surface.

34. A method of forming a composite, comprising the steps of:

a) forming a melt that includes magnesium, aluminum and oxygen, an element $\alpha$ that is a divalent cation having an ionic radius greater than divalent magnesium wherein the molar ratio of magnesium:$\alpha$ :aluminum:oxygen is (1-w):w:x:z, where w is greater than 0 and less than about 1, x is greater than about 2 and less than about 8, and z is equal to or greater than about 4 and equal to or less than about 13;

b) immersing a spinel seed crystal in the melt;

c) rotating the seed crystal at a rate in a range of between about 2 and about 12 revolutions per minute, while withdrawing the seed crystal from the melt at a rate in a range of between about 1.00 mm per hour and about 2.54 mm per hour to form thereby said monocrystalline lattice; and d) depositing a III-V lattice layer on a surface of the monocrystalline lattice, said III-V lattice layer including a crystalline lattice of a nitride of at least one element selected from the group consisting of Group III and Group V elements of the Periodic Table of Elements, thereby forming said composite.

35. The method of claim 34, wherein the nitride lattice layer is selected from the group consisting of GaN, AlGaN and InGaN.

36. The method of claim 35, further including the step of cleaving the spinel monocrystalline lattice to form a flat surface prior to depositing the III-V lattice layer, and wherein the nitride lattice layer is deposited on the flat surface.

37. The method of claim 36, further including the step of polishing the flat surface prior to depositing the nitride lattice layer.

38. The method of claim 37, wherein the element $\alpha$ is at least one element selected from the group consisting of calcium, cobalt and titanium.

39. The method of claim 38, wherein the element α is calcium.

40. The method of claim 38, wherein the element α is zinc.

41. The method of claim 37, wherein the melt further includes an element β, wherein said β is a trivalent cation that has an ionic radius greater than trivalent aluminum.

42. The method of claim 41, wherein β is at least one element selected from the group consisting of scandium, gallium, chromium and iron.

43. The method of claim 42, wherein β is scandium.

44. The method of claim 37, wherein w is 0, β is scandium and the III-V lattice layer is GaN.

45. The method of claim 44, wherein the III-V lattice layer is deposited by heteroepitaxial deposition.

46. The method of claim 45, wherein the composition of the spinel employed causes the spinel monocrystalline lattice layer and the III-V lattice layer to have a lattice mismatch of less than about 8.5%.

47. The method of claim 46, wherein the composition of the spinel employed causes the spinel monocrystalline lattice layer and the III-V lattice layer to have a lattice mismatch of less than about 5%.

* * * * *